(12) United States Patent
Lai et al.

(10) Patent No.: US 12,527,052 B2
(45) Date of Patent: Jan. 13, 2026

(54) HIGH VOLTAGE DEVICE AND METHOD FOR FORMING THE SAME

(71) Applicant: TAIWAN SEMICONDUCTOR MANUFACTURING COMPANY LTD., Hsinchu (TW)

(72) Inventors: Yu-Ying Lai, Changhua County (TW); Po-Chih Su, New Taipei (TW); Yu-Ting Wei, New Taipei (TW); Ruey-Hsin Liu, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 770 days.

(21) Appl. No.: 17/827,824

(22) Filed: May 30, 2022

(65) Prior Publication Data
US 2023/0387211 A1   Nov. 30, 2023

(51) Int. Cl.
| | |
|---|---|
| *H10D 62/17* | (2025.01) |
| *H01L 21/74* | (2006.01) |
| *H10D 84/01* | (2025.01) |
| *H10D 84/03* | (2025.01) |
| *H10D 84/83* | (2025.01) |

(52) U.S. Cl.
CPC .......... *H10D 62/371* (2025.01); *H01L 21/74* (2013.01); *H10D 84/0151* (2025.01); *H10D 84/0156* (2025.01); *H10D 84/038* (2025.01); *H10D 84/83* (2025.01)

(58) Field of Classification Search
CPC ............. H10D 62/371; H10D 84/0151; H10D 84/0156; H10D 84/038; H10D 84/83; H10D 30/603; H10D 30/0221; H10D 62/127; H10D 62/106; H01L 21/74
See application file for complete search history.

(56) References Cited

U.S. PATENT DOCUMENTS

2010/0301412 A1\*  12/2010  Parthasarathy ........ H10D 30/00
257/E27.06
2014/0332901 A1\*  11/2014  Yang .................... H10D 30/601
257/401

\* cited by examiner

*Primary Examiner* — Jacob Y Choi
*Assistant Examiner* — Ashley Nicole Blackwell
(74) *Attorney, Agent, or Firm* — WPAT LAW; Anthony King

(57) ABSTRACT

A high-voltage device includes a substrate, a gate structure over the substrate, a drain region disposed on a first side of the gate structure, a plurality of source regions disposed on a second side of the gate structure, and a plurality of doped regions disposed on the second side of the gate structure. The gate structure includes a plurality of first portions and a plurality of second portions alternately arranged. Width of the first portions are greater than widths of the second portions. The source regions are adjacent to the first portions of the gate structures, and the doped regions are adjacent to the second portions of the gate structure. The drain region and the source regions include dopants of a first conductivity type, and the doped regions include dopants of a second conductivity type. The first conductivity type and the second conductivity type are complementary to each other.

20 Claims, 18 Drawing Sheets

HIGH VOLTAGE DEVICE AND METHOD FOR FORMING THE SAME

BACKGROUND

Technological advances in semiconductor integrated circuit (IC) materials, design, processing, and manufacturing have enabled continual reduction in size of IC devices, where each generation has smaller and more complex circuits than the previous generation.

As semiconductor circuits composed of devices such as metal-oxide-semiconductor field-effect transistors (MOSFETs) are adapted for high-voltage applications, such as high-voltage lateral diffusion metal-oxide-semiconductor (HV LDMOS) devices, problems arise with respect to decreasing voltage performance as the downscaling continues with advanced technologies. To prevent punch-through between source and drain, or to reduce resistance of the source and drain, standard MOS fabrication process flows may be accompanied by multiple implantations with high doping concentrations. Substantial substrate leakage and voltage breakdown occur, causing degradation of device reliability.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
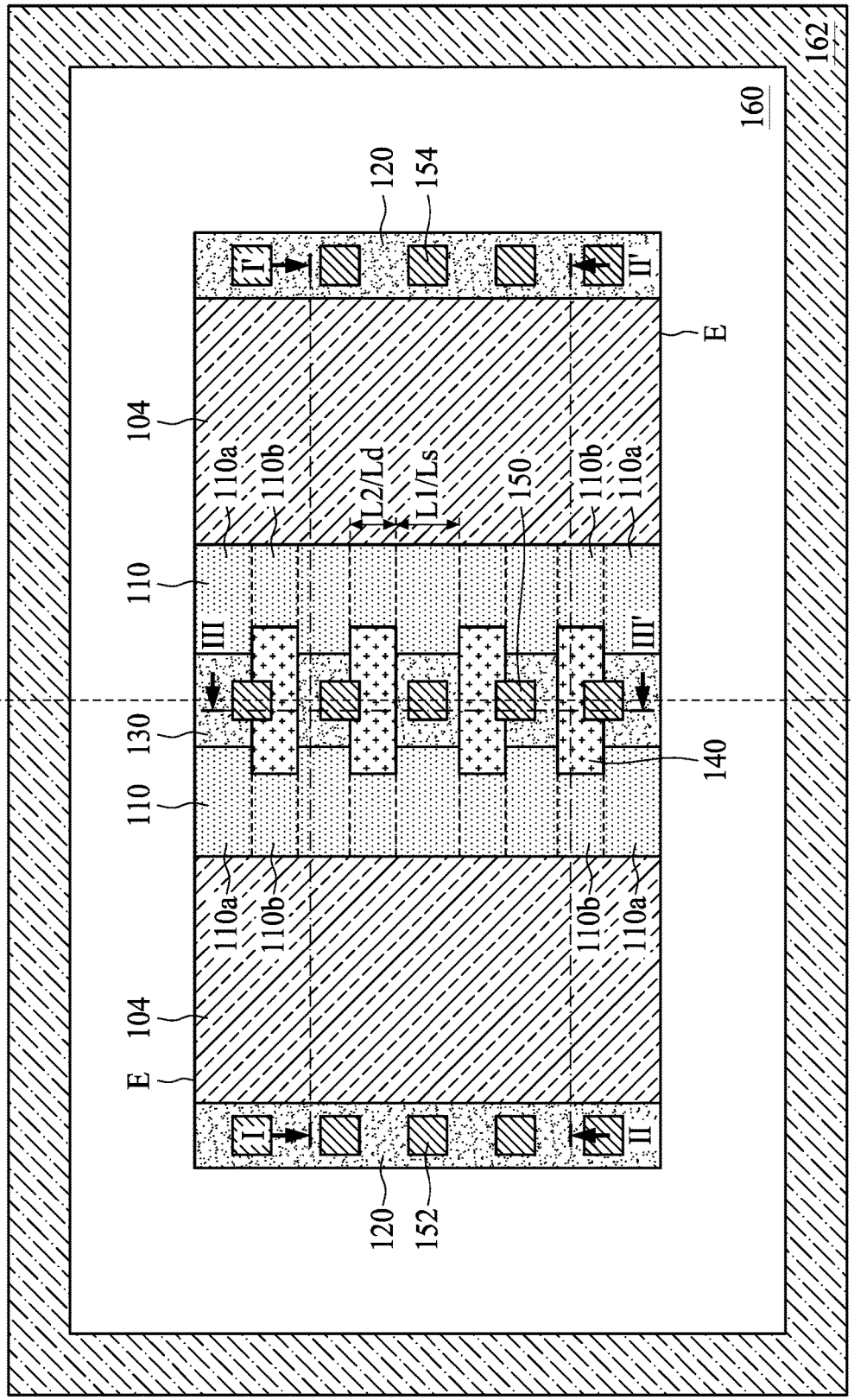
FIG. 1 is a top view of a high-voltage device according to aspects of the present disclosure in one or more embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat references numerals and/or letters in the various examples. This repetition is for the purpose of simplicity and clarity and does not in itself dictate a relationship between the various embodiments and/or configurations discussed.

This description of illustrative embodiments is intended to be read in connection with the accompanying drawings, which are to be considered part of the entire written description. In the description of embodiments disclosed herein, any references to direction or orientation are merely intended for convenience of description and are not intended in any way to limit the scope of the present disclosure. Relative terms such as "lower," "upper," "horizontal," "vertical," "above," "below," "up," "down," "top" and "bottom," as well as derivatives thereof (e.g., "horizontally," "downwardly," "upwardly," etc.), should be construed to refer to the orientation as then described or as shown in the drawing under discussion. These relative terms are for convenience of description only and do not require that the apparatus be constructed or operated in a particular orientation. Terms such as "attached," "affixed," "connected" and "interconnected" refer to a relationship wherein structures are secured or attached to one another either directly or indirectly through intervening structures, as well as both movable or rigid attachments or relationships, unless expressly described otherwise. Moreover, the features and benefits of the disclosure are illustrated by references to the embodiments. Accordingly, the disclosure expressly should not be limited to such embodiments illustrating some possible non-limiting combination of features that may exist alone or in other combinations of features, the scope of the disclosure being defined by the claims appended hereto.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" or "about" generally mean within a value or range that can be contemplated by people having ordinary skill in the art. Alternatively, the terms "substantially," "approximately" or "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

On-state breakdown voltage and on-resistance (Ron) are two important characteristics of a high-voltage (HV) device used in a power switch circuit. It is known that reduction of bulk resistance plays an important role in determining the on-state breakdown voltage. However, in some comparative approaches, an HV device that has a desired on-state breakdown voltage may suffer from pitch penalty, drain current reduction and/or on-resistance increase.

The present disclosure therefore provides an HV device having a lower bulk resistance which allows an increase in on-state breakdown voltage. In some embodiments, the HV device includes a plurality of doped regions and a plurality of source regions alternately arranged. Further, widths of the doped regions are greater than widths of the source regions. Carrier collection is improved by the added doped regions. Accordingly, bulk resistance is reduced and the on-state breakdown voltage is increased.

In some embodiments, an HV device 100 is provided. The HV device 100 can be an n-type high-voltage device, but the disclosure is not limited thereto. For example, in some alternative embodiments, the HV device 100 can be a p-type HV device. In some embodiments, the HV device 100 can be referred to as a high-voltage laterally-diffused MOS (HV LDMOS) transistor device, a high-voltage extended-drain MOS (HV EDMOS) transistor device, or any other HV device.

Figure 2:
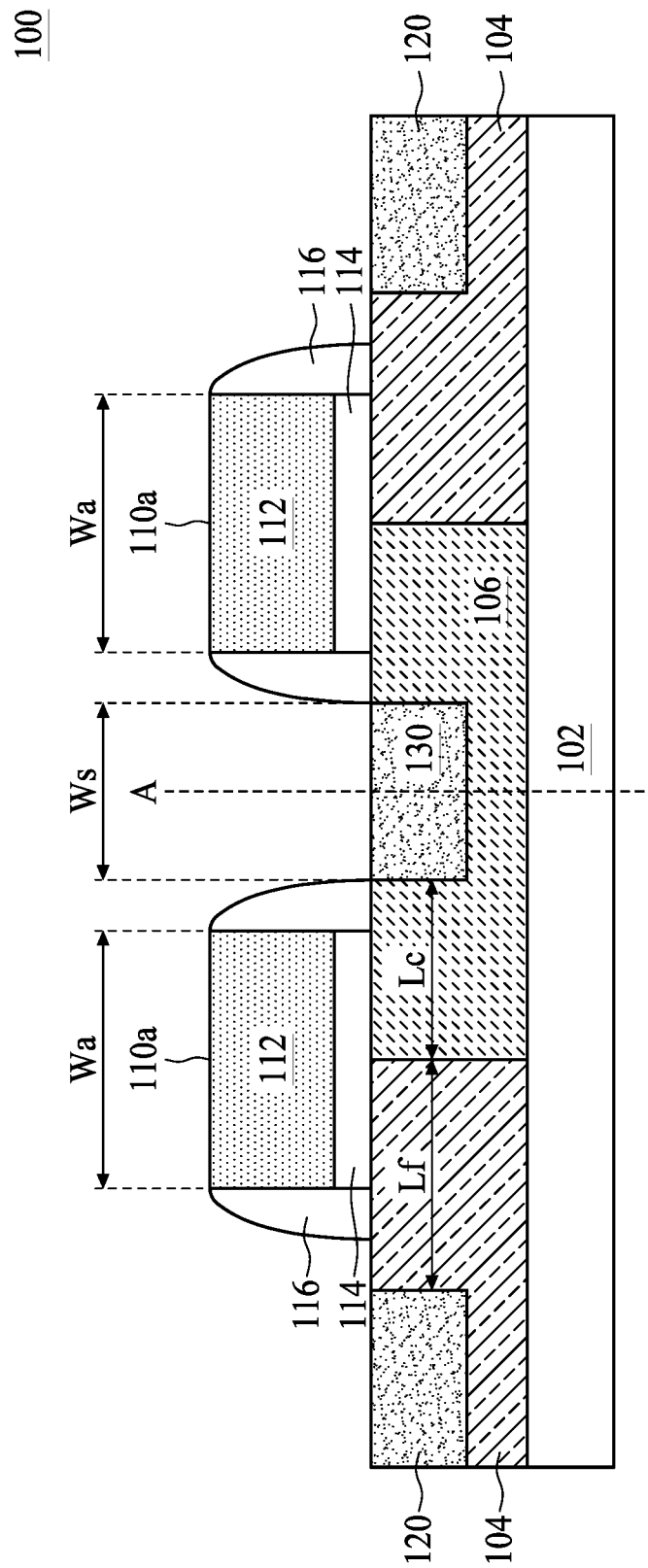
FIG. 2 is a cross-sectional view taken along line I-I' of FIG. 1.
Figure 3:
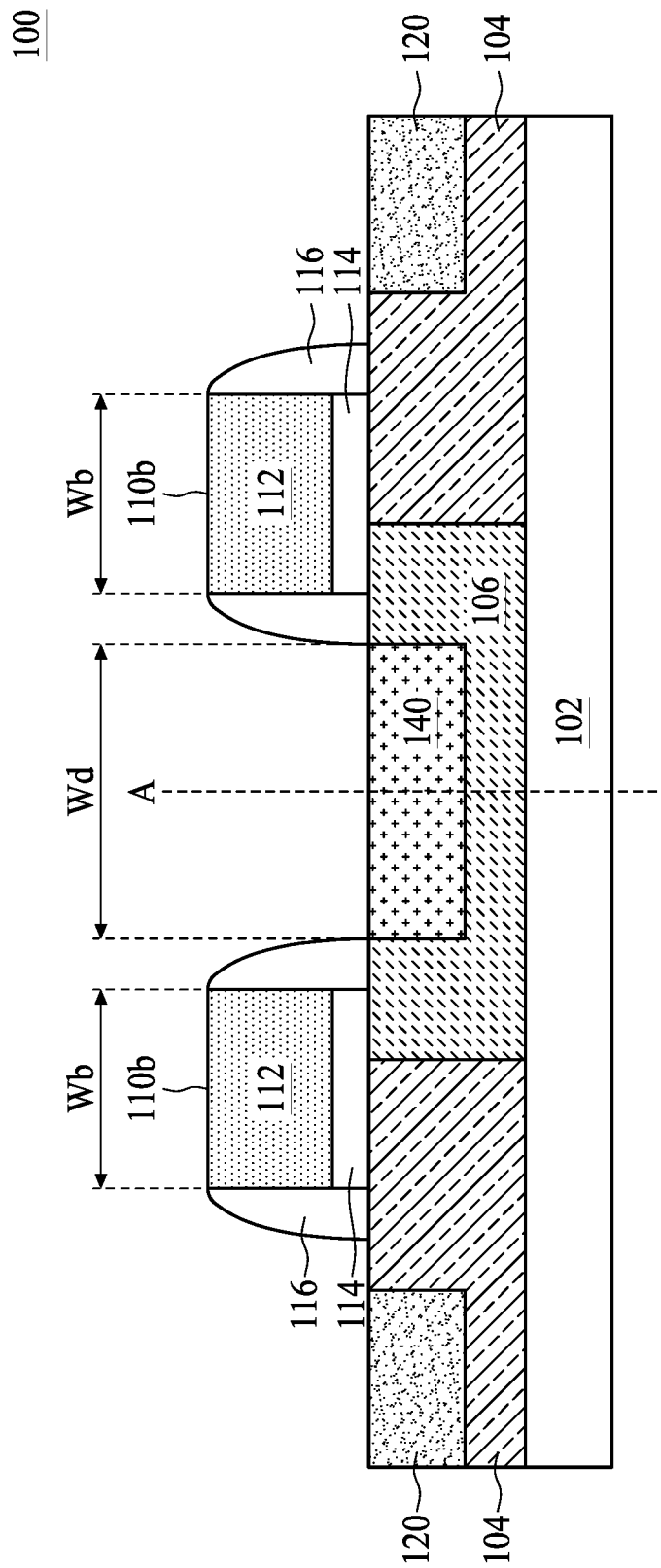
FIG. 3 is a cross-sectional view taken along line II-II' of FIG. 1.
Figure 4:
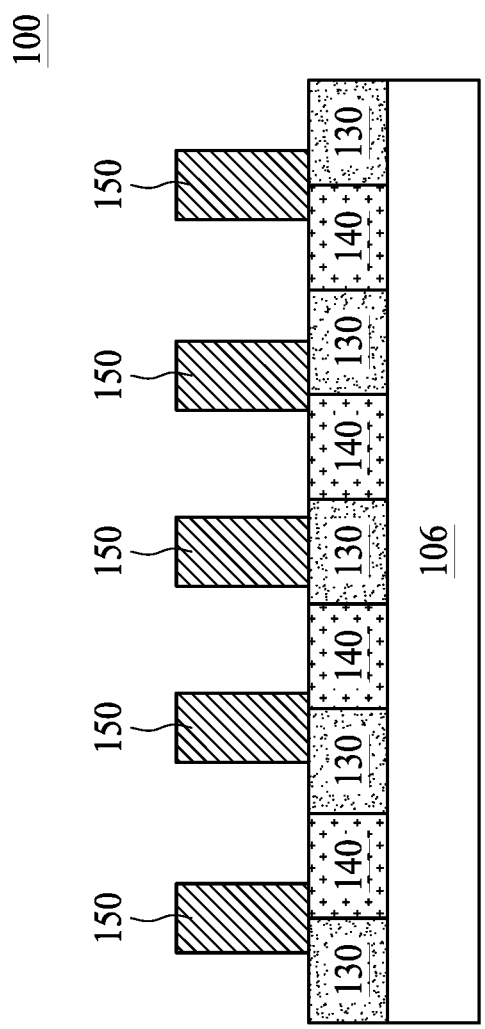
FIG. 4 is a cross-sectional view taken along line III-III' of FIG. 1.

Please refer to FIGS. 1 to 4. FIG. 1 illustrates a top view of an HV device 100, FIG. 2 is a cross-sectional view taken along line I-I' of FIG. 1, FIG. 3 is a cross-sectional view taken along line II-II' of FIG. 1, and FIG. 4 is a cross-sectional view taken along line III-III' of FIG. 1. In some embodiments, the HV device 100 includes a substrate 102 (shown in FIGS. 2 and 3). The substrate 102 can include an elementary semiconductor including silicon or germanium in a single crystal form, a polycrystalline form, or an amorphous form; a compound semiconductor material including at least one of silicon carbide, gallium arsenide, gallium phosphide, indium phosphide, indium arsenide, and indium antimonide; an alloy semiconductor material including at least one of SiGe, GaAsP, AlInAs, AlGaAs, GaInAs, GaInP, and GaInAsP; any other suitable material; or a combination thereof. In some embodiments, the alloy semiconductor substrate may be a SiGe alloy with a gradient Ge feature in which the Si and Ge composition changes from one ratio at one location to another ratio at another location of the gradient SiGe feature. In another embodiment, the SiGe alloy is formed over a silicon substrate. In some embodiments, a SiGe alloy can be mechanically strained by another material in contact with the SiGe alloy. Furthermore, the substrate 102 may be a semiconductor on insulator, such as silicon on insulator (SOI). In some embodiments, the substrate 102 may include a doped epitaxial layer or a buried layer. In some embodiments, the substrate 102 may have a multilayer structure, or may include a multilayer compound semiconductor structure.

The HV device 100 includes a well region 104. In some embodiments, a bottom of the well region 104 is in contact with the substrate 102. However, in some embodiments, other well regions or doped regions may be disposed between the bottom of the well region 104 and the substrate 102. In some embodiments, the well region 104 includes dopants of a first conductivity type, and the substrate 102 includes dopants of a second conductivity type. The first conductivity type and the second conductivity type are complementary to each other. In some embodiments, the first conductivity type is an n type, and the second conductivity type is a p type. However, in some alternative embodiments, the first conductivity type is a p type, and the second conductivity type is an n type. In some embodiments, n-type dopants include arsenic (As), phosphorus (P), other group V elements, or any combination thereof. In some embodiments, p-type dopants include boron (B), other group III elements, or any combination thereof. The well region 104 can be referred to as a drift region. In some embodiments, the well region 104 can be referred to as a high-voltage n-type well (HVNW). In some embodiments, a doping concentration of the well region 104 is between approximately $10^{17}$ ion/cm$^3$ and approximately $10^{19}$ ion/cm$^3$, but the disclosure is not limited thereto.

In some embodiments, the HV device 100 may include two well regions 104 symmetrically disposed over the substrate 102, but the disclosure is not limited thereto.

The HV device 100 further includes another well region 106 disposed over the substrate 102. In some embodiments, at least a portion of a side of the well region 106 is in contact with the well region 104. A bottom of the well region 106 is in contact with the substrate 102. However, other well regions or doped regions may be formed between the well region 106 and the substrate 102. The well region 106 can include the second conductivity type. In some embodiments, when the HV device 100 includes two well regions 104, the region 106 is disposed between the two well regions 104. Further, sides of the well region 106 are respectively in contact with the two well regions 104. In some embodiments, a doping concentration of the well region 106 is between approximately $10^{17}$ ion/cm$^3$ and approximately $10^{19}$ ion/cm$^3$, but the disclosure is not limited thereto.

The HV device 100 includes a gate structure 110 disposed over the substrate 102. As shown in FIGS. 2 and 3, the gate structure 110 covers a portion of the well region 104 and a portion of the well region 106. In some embodiments, the gate structure 110 includes a gate conductive layer 112 and a gate dielectric layer 114 between the gate conductive layer 112 and the substrate 102. The gate conductive layer 112 can include polysilicon, silicon-germanium, and at least one metallic material including elements and compounds such as Mo, Cu, W, Ti, Ta, TiN, TaN, NiSi, CoSi, or other suitable conductive materials known in the art. In some embodiments, the gate conductive layer 112 includes a work function metal layer that provides a metal gate with an n-type work function or p-type work function. Materials having the p-type work function materials include materials such as ruthenium, palladium, platinum, cobalt, nickel, conductive metal oxide, or other suitable materials. Materials having the n-type work function include materials such as hafnium zirconium, titanium, tantalum, aluminum, metal carbides (e.g., hafnium carbide, zirconium carbide, titanium carbide, and aluminum carbide), aluminides, or other suitable materials.

The gate dielectric layer 114 can be a single layer or a multi-layer structure. In some embodiments, the gate dielectric layer 114 is a multi-layer structure that includes an interfacial layer and a high-k dielectric layer. The interfacial layer can include dielectric material such as silicon oxide, silicon nitride, silicon oxynitride, other dielectric material, or a combination thereof. The high-k dielectric layer can include high-k dielectric material such as $HfO_2$, HfSiO, HfSiON, HfTaO, HfTiO, HfZrO, other suitable high-k dielectric materials, or a combination thereof. In some embodiments, the high-k dielectric material can further be selected from metal oxides, metal nitrides, metal silicates, transition metal-oxides, transition metal-nitrides, transition-metal silicates, metal oxynitrides, metal aluminates, and combinations thereof.

In some embodiments, the gate structure 110 may include spacers 116 disposed over sidewalls. However, the spacers 116 are omitted from FIG. 1. In some embodiments, the spacers 116 include multiple layers, but the disclosure is not limited thereto. In some embodiments, the spacers 116 are made of silicon nitride (SiN), silicon carbide (SiC), silicon oxide ($SiO_X$), silicon oxynitride (SiON), silicon carbide or any other suitable material, but the disclosure is not limited thereto.

In some embodiments, the HV device 100 includes two gate structures 110 symmetrically disposed over the substrate 102. Each of the gate structures 110 covers a portion of the well region 104 and a portion of the well region 106.

Still referring to FIGS. 1 to 3, in some embodiments, each of the gate structures 110 includes a plurality of first portions 110a and a plurality of second portions 110b alternately arranged. Further, the first portions 110a and the second portions 110b are coupled to each other. In some embodiments, the second portions 110b of the gate structure 110 are separated from an edge E of the HV device 100 by the first portions 110a of the gate structure 110. In some embodiments, when the HV device 100 includes two gate structures 110, each of the gate structures 110 includes the plurality of first portions 110a and the plurality of second portions 110b alternately arranged.

As shown in FIGS. 2 and 3, each of the first portions 110a includes a width Wa. and each of the second portions 110b includes a width Wb. Further, the width Wa of the first portions 110a is greater than the width Wb of the second portions 110b. Thus, the gate structure 110 formed of the first portions 110a and the second portions 110b may have a comb-like shape, as shown in FIG. 1. The comb-like gate structure 110 may have straight side referred to as a first side and a toothed edge referred to as a second side, as shown in FIG. 1.

Each of the first portions 110a has a length L1, and each of the second portions 110b has a length L2. In some embodiments, the lengths L1 of the first portions 110a and the lengths L2 of the second portions 110b are similar, as shown in FIG. 1. However, in other embodiments, the lengths L1 of the first portions 110a may be greater or less than the lengths L2 of the second portions 110b, depending on different product designs.

Still referring to FIGS. 1 to 3, the HV device 100 includes a drain region 120 disposed in the well region 104. In some embodiments, the drain region 120 is disposed on the first side of the gate structure 110. The drain region 120 is separated from the gate structure 110 and the substrate 102 by the well region 104. In some embodiments, a bottom and at least a portion of a sidewall of the drain region 120 are in contact with the well region 104, but the disclosure is not limited thereto. In some embodiments, other doped regions may be added between the drain region 120 and the well region 104, depending on product design. The drain region 120 includes the first conductivity type. A doping concentration of the drain region 120 is greater than the doping concentration of the well region 104. For example, the doping concentration of the drain region 120 is between approximately $10^{19}$ ion/$cm^3$ and approximately $10^{21}$ ion/$cm^3$, but the disclosure is not limited thereto. In some embodiments, the HV device 100 includes two drain regions 120 respectively disposed in the well regions 104.

The HV device 100 includes a plurality of source regions 130 disposed in the well region 106 on the second side of the gate structure 110. In some embodiments, sidewalls and a bottom of each source region 130 are in contact with the well region 106, as shown in FIG. 2. However, in other embodiments, other doped regions may be added between the source region 130 and the well region 106, depending on product design. The source region 130 includes the first conductivity type, and doping concentrations of the source region 130 are similar to the doping concentration of the drain region 120. For example, a doping concentration of each source region 130 is between approximately $10^{19}$ ion/$cm^3$ and approximately $10^{21}$ ion/$cm^3$, but the disclosure is not limited thereto. In some embodiments, each of the source regions 130 is adjacent to one of the first portions 110a of the gate structure 110. In some embodiments, when the HV device 100 includes the two gate structures 110, each of the source regions 130 is disposed between the first portions 110a of the two gate structures 110.

In some embodiments, the HV device 100 further includes a plurality of doped regions 140 disposed in the well region 106. The doped regions 140 and the source regions 130 are alternately arranged, as shown in FIG. 1. Further, the doped regions 140 and the source regions 130 are coupled to each other. In some embodiments, the doped regions 140 are separated from the edge E of the HV device 100 by the source regions 130. In some embodiments, sidewalls and a bottom of each doped region 140 are in contact with the well region 106, as shown in FIG. 3. However, in other embodiments, other doped regions may be added between the doped region 140 and the well region 106, depending on product design. The doped regions 140 include the second conductivity type. Further, doping concentrations of the doped regions 140 are greater than the doping concentration of the well region 106. For example, the doping concentration of the doped region 140 is between approximately $10^{19}$ ion/$cm^3$ and approximately $10^{21}$ ion/$cm^3$, but the disclosure is not limited thereto. In some embodiments, each of the doped regions 140 is adjacent to one of the second portions 110b of the gate structure 110. In some embodiments, when the HV device 100 includes the two gate structures 110, each of the doped regions 140 is disposed between the second portions 110b of the two gate structures 110.

Referring to FIGS. 2 and 3, in some embodiments, each of the source regions 130 has a width Ws, and each of the doped regions 140 has a width Wd. The width Wd of the doped regions 140 is greater than the width Ws of the source regions 130. A difference is obtained between the widths Wd of the doped regions 140 and the widths Ws of the source regions 130. In some embodiments, the difference is between approximately 0.1 micrometers and approximately 2 micrometers, but the disclosure is not limited thereto. In some embodiments, a ratio of a sum of areas of the source regions 130 to a sum of areas of the doped regions 140 is between 1:5 and 5:1. Such ratio can be modified according to different product designs.

In some embodiments, each of the source regions 130 has a length Ls, and each of the doped regions 140 has a length Ld. The lengths Ls of the source regions 130 are similar to the lengths L1 of the first portions 110a of the gate structure 110, and the lengths Ld of the doped regions 140 are similar to the lengths L2 of the second portions 110b of the gate structure 110.

Still referring to FIGS. 2 and 3, a length Lf of the drift region is defined between a side of the well region 104 in contact with the well region 106 and a side of the well region 104 in contact with a side of the drain region 120. A length Lc of a channel region is defined between a side of the well region 106 in contact with the well region 104 and a side of the well region 106 in contact with a side of the source region 130. In some embodiments, a ratio of the length Lf of the drift region to the length Lc of the channel region is between approximately 0.1 and approximately 10, but the disclosure is not limited thereto.

Referring to FIGS. 1 and 4, in some embodiments, a plurality of conductive structures 150 are disposed over the well region 106. Further, the conductive structures 150 are disposed over the source regions 130 and the doped regions 140. In some embodiments, one of the conductive structures 150 may be entirely in contact with the source region 130. In some embodiments, one of the conductive structures 150 may be entirely in contact with the doped region 140. In some embodiments, one of the conductive structures 150 may be in contact with a portion of the source region 130 and a portion of the doped region 140. Thus, the arrangement of the conductive structures 150 is flexible.

Referring to FIG. 1, a plurality of conductive structure 152 are disposed over the well region 104. Further, the conductive structure 152 are in contact with the drain regions 120.

In some embodiments, the two well regions 104, the two gate structures 110, the well region 106, the source regions 130 and the doped regions 140 are disposed between the two drain regions 120, as shown in FIG. 1. Further, the conductive structures 152, the drain regions 120, the well regions 104, the gate structures 110, the well region 106, the source regions 130 and the doped regions 140 are line symmetrical with respect to a central axis A, as shown in FIGS. 1 to 3.

In some embodiments, the HV device 100 further includes an isolation structure 160 surrounding the well regions 104 and 106, the gate structures 110, the drain regions 120, the source regions 130, the doped regions 140, and the conductive structures 150 and 152. The isolation structure 160 may be used to define a location and a dimension of the HV device 100.

In some embodiments, the HV device 100 further includes a guard ring 162. The guard ring 162 may be a doped region having dopants of the second conductivity type. As shown in FIG. 1, the guard ring 162 surrounds the isolation structure 160. In some embodiments, the guard ring 162 allows an electrical bias to be applied to the substrate 102.

In some embodiments, the doped regions 140 of the HV device 100 help collect carriers generated during operation. Thus, a bulk resistance of the HV device 100 is reduced and an on-state breakdown voltage is increased. Further, the on-state breakdown voltage of the HV device 100 can be increased by adjusting the ratio of the sum of the areas of the source regions 130 to the sum of the areas of the doped regions 140. In some embodiments, such improvements to the bulk resistance and the on-state breakdown voltage are achieved with less pitch penalty due to the presence of the doped regions 140. In other words, an effect on a dimension of the HV device 100 may be less than that in a prior art even with addition of the doped regions 140 between the source regions 130.

Figure 5:
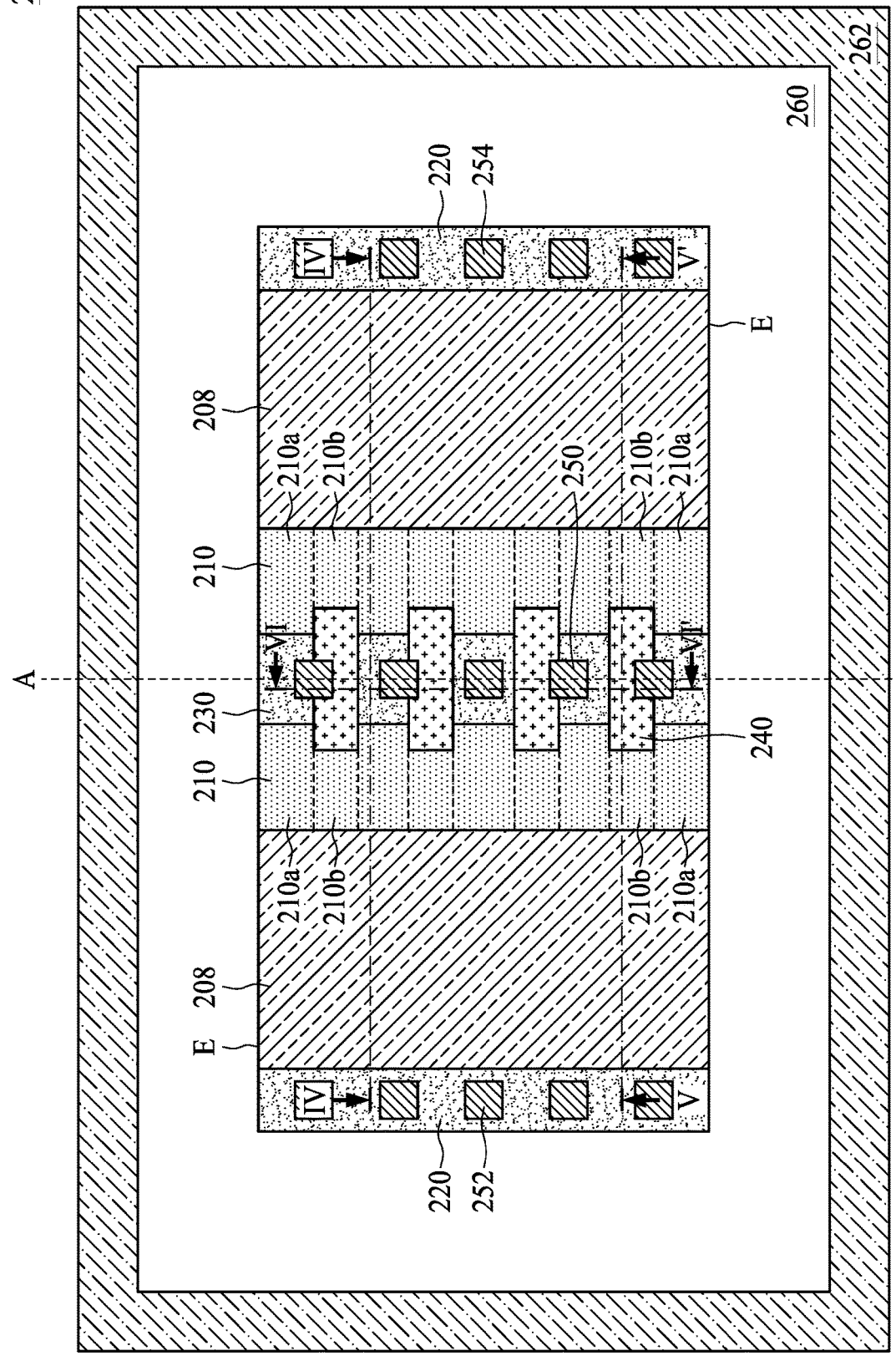
FIG. 5 is a top view of a high-voltage device according to aspects of the present disclosure in one or more embodiments.
Figure 6:
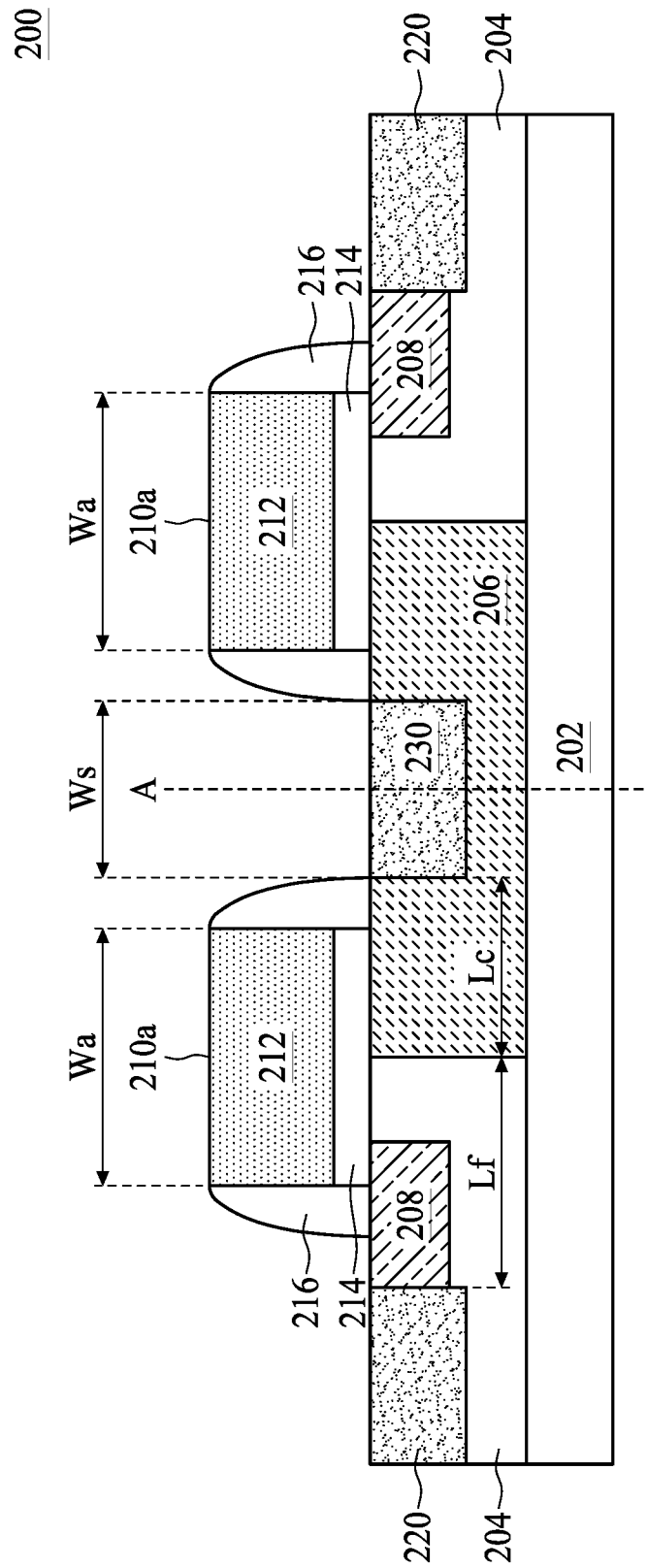
FIG. 6 is a cross-sectional view taken along line IV-IV' of FIG. 5.
Figure 7:
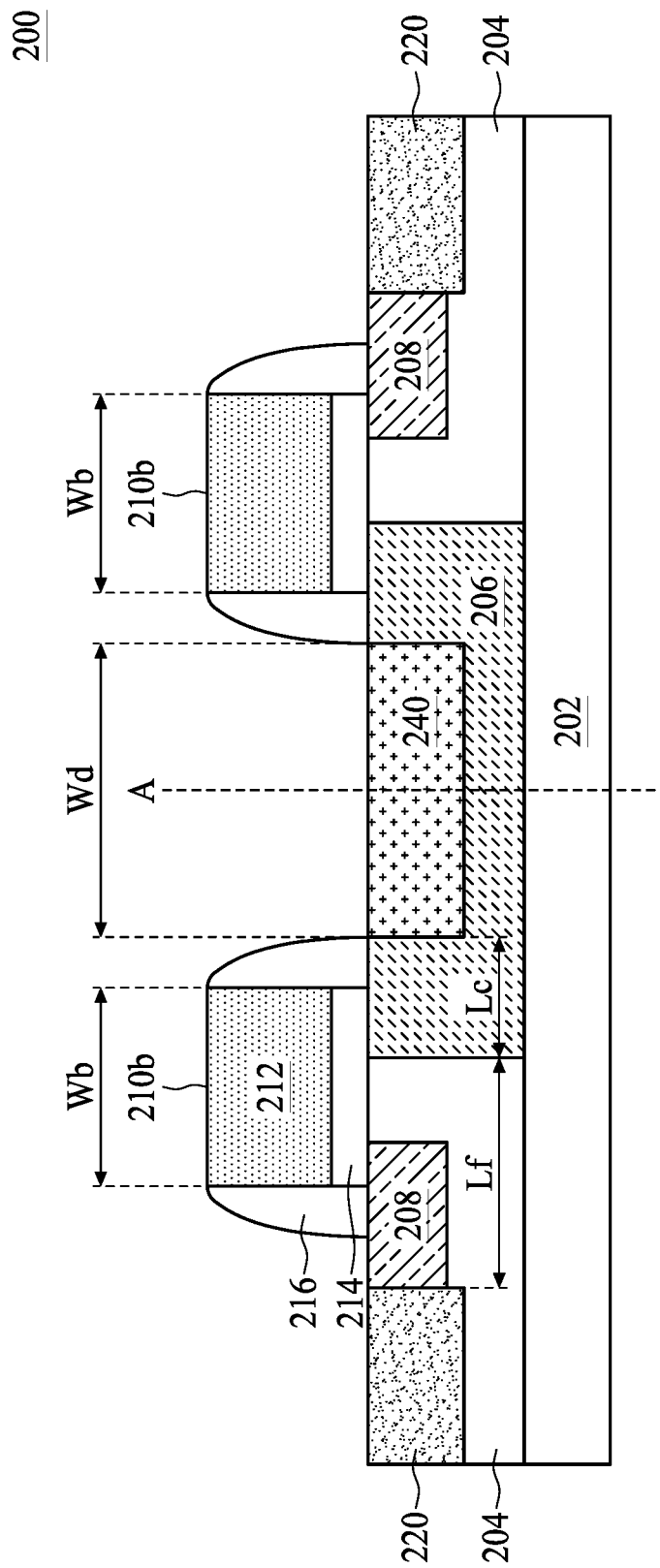
FIG. 7 is a cross-sectional view taken along line V-V' of FIG. 5.
Figure 8:
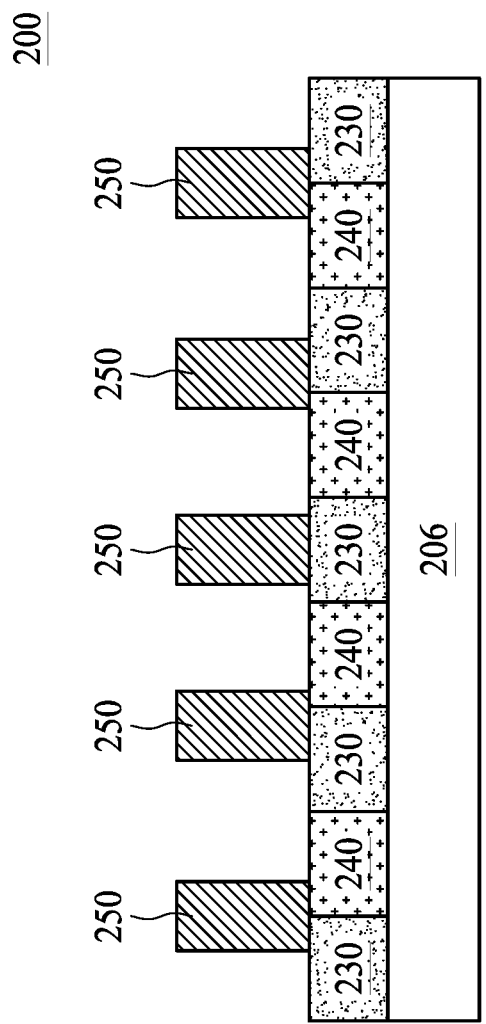
FIG. 8 is a cross-sectional view taken along line VI-VI' of FIG. 5.

Please refer to FIGS. 5 to 8. FIG. 5 illustrates atop view of an HV device 200, FIG. 6 is a cross-sectional view taken along line IV-IV' of FIG. 5, FIG. 7 is a cross-sectional view taken along line V-V' of FIG. 5, and FIG. 8 is a cross-sectional view taken along line VI-VI' of FIG. 5. It should be noted that same elements in FIGS. 1 to 8 may include same materials; therefore, repeated descriptions of such details are omitted for brevity. In some embodiments, the HV device 200 includes a substrate 202 (shown in FIGS. 6 and 7). In some embodiments, the substrate 202 may include a doped epitaxial layer or a buried layer. In some embodiments, the substrate 202 may have a multilayer structure, or may include a multilayer compound semiconductor structure.

The HV device 200 includes a well region 204. In some embodiments, a bottom of the well region 204 is in contact with the substrate 202. However, in some embodiments, other well regions or doped regions may be disposed between the bottom of the well region 204 and the substrate 202. In some embodiments, the well region 204 includes dopants of a first conductivity type, and the substrate 202 includes dopants of a second conductivity type. The first conductivity type and the second conductivity type are complementary to each other. In some embodiments, the first conductivity type is an n type, and the second conductivity type is a p type. However, in some alternative embodiments, the first conductivity type is a p type, and the second conductivity type is an n type. The well region 204 can be referred to as a drift region. In some embodiments, the well region 204 can be referred to as a high-voltage n-type well (HVNW). In some embodiments, a doping concentration of the well region 204 is between approximately $10^{17}$ ion/cm$^3$ and approximately $10^{19}$ ion/cm$^3$, but the disclosure is not limited thereto.

As mentioned above, the HV device 200 may include two well regions 204 symmetrically disposed over the substrate 202, but the disclosure is not limited thereto.

The HV device 200 further includes another well region 206 disposed over the substrate 202. In some embodiments, at least a portion of a side of the well region 206 is in contact with the well region 204. In some embodiments, a bottom of the well region 206 is in contact with the substrate 202. However, other well regions or doped regions may be formed between the well region 206 and the substrate 202. In some embodiments, when the HV device 200 includes two well regions 204, the well region 206 is disposed between the two well regions 204. Further, side edges of the well region 206 are respectively in contact with the two well regions 204. The well region 206 can include the second conductivity type. In some embodiments, a doping concentration of the well region 206 is between approximately $10^{17}$ ion/cm$^3$ and approximately $10^{19}$ ion/cm$^3$, but the disclosure is not limited thereto.

The HV device 200 includes a gate structure 210 disposed on the substrate 202. As shown in FIGS. 6 and 7, the gate structure 210 covers a portion of the well region 204 and a portion of the well region 206. In some embodiments, the gate structure 210 includes a gate conductive layer 212 and a gate dielectric layer 214 between the gate conductive layer 212 and the substrate 202. In some embodiments, the gate structure 210 may include spacers 216 disposed over sidewalls. However, the spacers 216 are omitted from FIG. 5. As mentioned above, the HV device 200 may include two gate structures 210 symmetrically disposed over the substrate 202. Each of the gate structures 210 covers a portion of the well region 204 and a portion of the well region 206.

Still referring to FIGS. 5 to 7, in some embodiments, the gate structure 210 includes a plurality of first portions 210a and a plurality of second portions 210b. The configurations, arrangements and dimensions of the first portions 210a and the second portions 210b of the gate structure 210 are similar to those of the gate structure 110; therefore, repeated descriptions are omitted for brevity. Accordingly, the gate structure 210 having the first portions 210a and the second portions 210b of different widths has a comb-like configuration. The comb-like gate structure 210 may have straight edge referred to as a first side and a toothed edge referred to as a second side, as shown in FIG. 5.

Still referring to FIGS. 5 to 8, the HV device 200 includes a drain region 220 disposed in the well region 204. In some embodiments, the drain region 220 is disposed on the first side of the gate structure. The drain region 220 is separated from the gate structure 210 and the substrate 202 by the well region 204. The drain region 220 includes the first conductivity type. In embodiments, the configurations, arrangements and parameters of the drain region 220 are similar to those of the drain region 120; therefore, repeated descriptions are omitted for brevity.

In some embodiments, the HV device 200 further includes an isolation structure 208 disposed in the well region 204. In some embodiments, the drain region 220 is separated from the gate structure 210 by the isolation structure 208, as shown in FIGS. 6 and 7. In some embodiments, the isolation structure 208 can be a shallow trench isolation (STI), as shown in FIGS. 6 and 7. In other embodiments, the isolation structure 208 includes a structure of a local oxidization of silicon (LOCOS) structure, or any other suitable isolation structure. Further, the gate structure 210 covers a portion of the isolation structure 208, as shown in FIGS. 6 and 7.

The HV device 200 includes a plurality of source regions 230 disposed in the well region 206 on the second side of the gate structure 210. The source regions 230 include the first conductivity type, and doping concentrations of the source region 230 are similar to the doping concentration of the drain region 220. In some embodiments, each of the source regions 230 is adjacent to one of the first portions 210a of the gate structure 210. In some embodiments, when the HV device 200 includes the two gate structures 210, each of the source regions 230 is disposed between the first portions 210a of the two gate structures 210. In embodiments, the configurations, arrangements and parameters of the source region 230 are similar to those of the source region 130; therefore, repeated descriptions are omitted for brevity.

In some embodiments, the HV device 200 further includes a plurality of doped regions 240 disposed in the well region 206. The doped regions 240 and the source regions 230 are alternately arranged as shown in FIG. 5. Further, the doped regions 240 and the source regions 230 are coupled to each other. In some embodiments, the doped regions 240 are separated from an edge E of the HV device 200 by the source regions 230. The doped regions 240 include the second conductivity type. Further, doping concentrations of the doped regions 240 are greater than a doping concentration of the well region 206. In some embodiments, the configurations, arrangements and parameters of the doped regions 240 are similar to those of the doped regions 140; therefore, repeated descriptions are omitted for brevity. In some embodiments, each of the doped regions 240 is adjacent to one of the second portions 210b of the gate structure 210. In some embodiments, when the HV device 200 includes the two gate structures 210, each of the doped regions 240 is disposed between the second portions 210b of the two gate structures 210.

Referring to FIGS. 6 and 7, in some embodiments, each of the source regions 230 has a width Ws, and each of the doped regions 240 has a width Wd. The width Wd of the doped regions 240 is greater than the width Ws of the source regions 230. A difference is obtained between the width Wd of the doped regions 240 and the width Ws of the source regions 230. As mentioned above, the difference is between approximately 0.1 micrometers and approximately 2 micrometers, but the disclosure is not limited thereto. In some embodiments, a ratio of a sum of areas of the source regions 230 to a sum of areas of the doped regions 240 is between 1:5 and 5:1. Such ratio can be modified according to different product designs.

Still referring to FIGS. 6 and 7, a length Lf of a drift region is defined between a side of the well region 204 in contact with the well region 206 and a side of the well region 204 in contact with a side of the drain region 220. A length Lc of a channel region is defined between a side of the well region 206 in contact with the well region 204 and a side of the well region 206 in contact with a side of the source region 230. In some embodiments, a ratio of the length Lf of the drift region to the length Lc of the channel region is between approximately 0.1 and approximately 10, but the disclosure is not limited thereto.

Referring to FIGS. 5 and 8, in some embodiments, a plurality of conductive structures 250 are disposed over the well region 206. Further, the conductive structures 250 are also disposed over the source regions 230 and the doped regions 240. The arrangements of the conductive structures 250 may be similar to those of the conductive structure 150; therefore, repeated descriptions are omitted for brevity. A plurality of conductive structures 252 are disposed over the well region 204. Further, the conductive structure 252 are in contact with the drain regions 220.

The conductive structures 250 and 252, the drain regions 220, the well regions 204, the gate structures 210, the well region 206, the source regions 230 and the doped regions 240 are line symmetrical with respect to a central axis A, as shown in FIGS. 5 to 7.

In some embodiments, the HV device 200 further includes an isolation structure 260 and a guard ring 262. The configuration and arrangements of the isolation structure 260 and the guard ring 262 may be similar to those of the isolation structure 160 and the guard ring 162; therefore, repeated descriptions are omitted for brevity.

The doped regions 240 of the HV device 200 help collect carriers generated during operation. Thus, a bulk resistance of the HV device 200 is reduced and an on-state breakdown voltage is increased. Further, the on-state breakdown voltage of the HV device 200 can be increased by adjusting the ratio of the sum of the areas of the source regions 230 to the sum of the areas of the doped regions 240. In some embodiments, such improvements to the bulk resistance and the on-state breakdown voltage are achieved with less pitch penalty due to the presence of the doped regions 240. In other words, an effect on a dimension of the HV device 200 may be less than that in a prior art even with addition of the doped regions 240 between the source regions 230.

Figure 9:
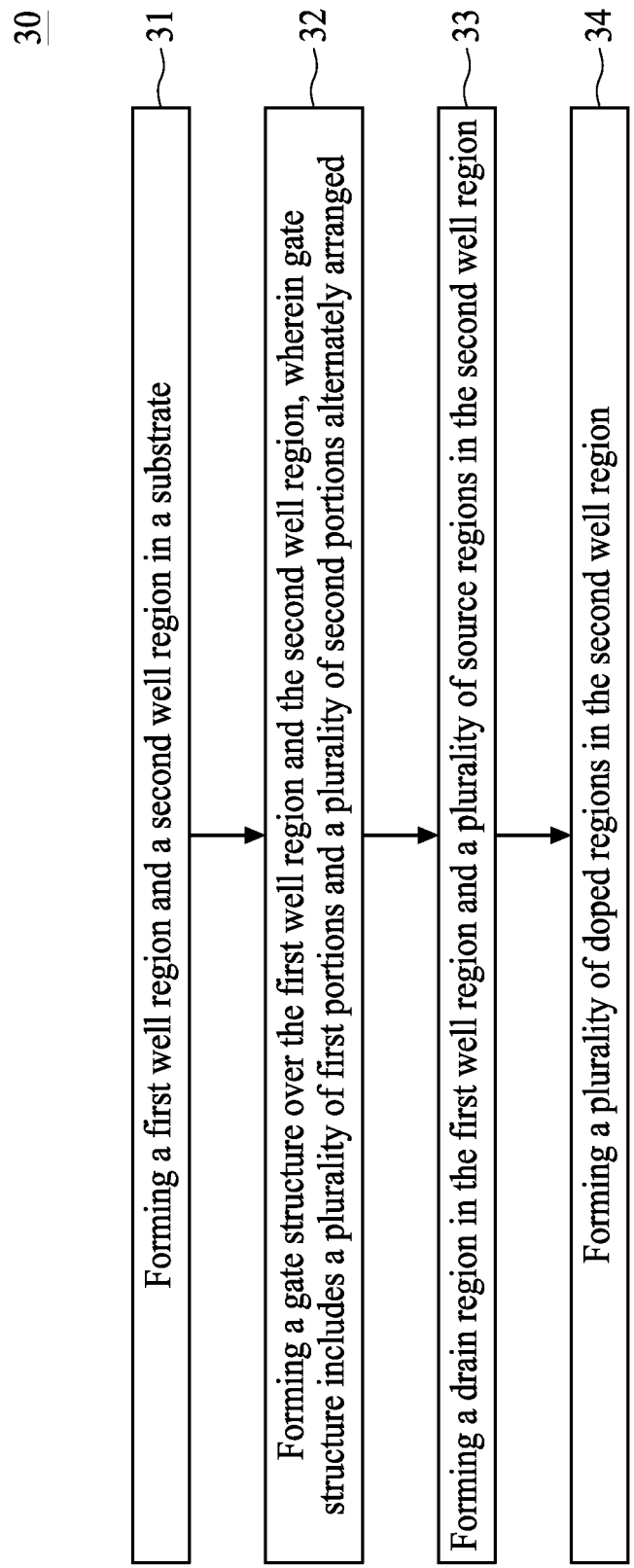
FIG. 9 is a flowchart representing a method for forming a semiconductor structure according to aspects of the present disclosure.

FIG. 9 is a flowchart representing a method for forming an HV device 30 according to aspects of the present disclosure. The method 30 includes a number of operations (31, 32, 33 and 34). The method 30 will be further described according to one or more embodiments. It should be noted that the operations of the method 30 may be rearranged or otherwise modified within the scope of the various aspects. It should further be noted that additional processes may be provided before, during, and after the method 30, and that some other processes may be only briefly described herein. Thus, other implementations are possible within the scope of the various aspects described herein.

Please refer to FIGS. 10A to 13B, which are schematic drawings illustrating a semiconductor structure at various fabrication stages according to aspects of the present disclosure in one or more embodiments. It should be noted that same elements in FIGS. 1 to 8 and FIGS. 10A to 13B may include same materials; therefore, such details are omitted for brevity.

Figure 10A:
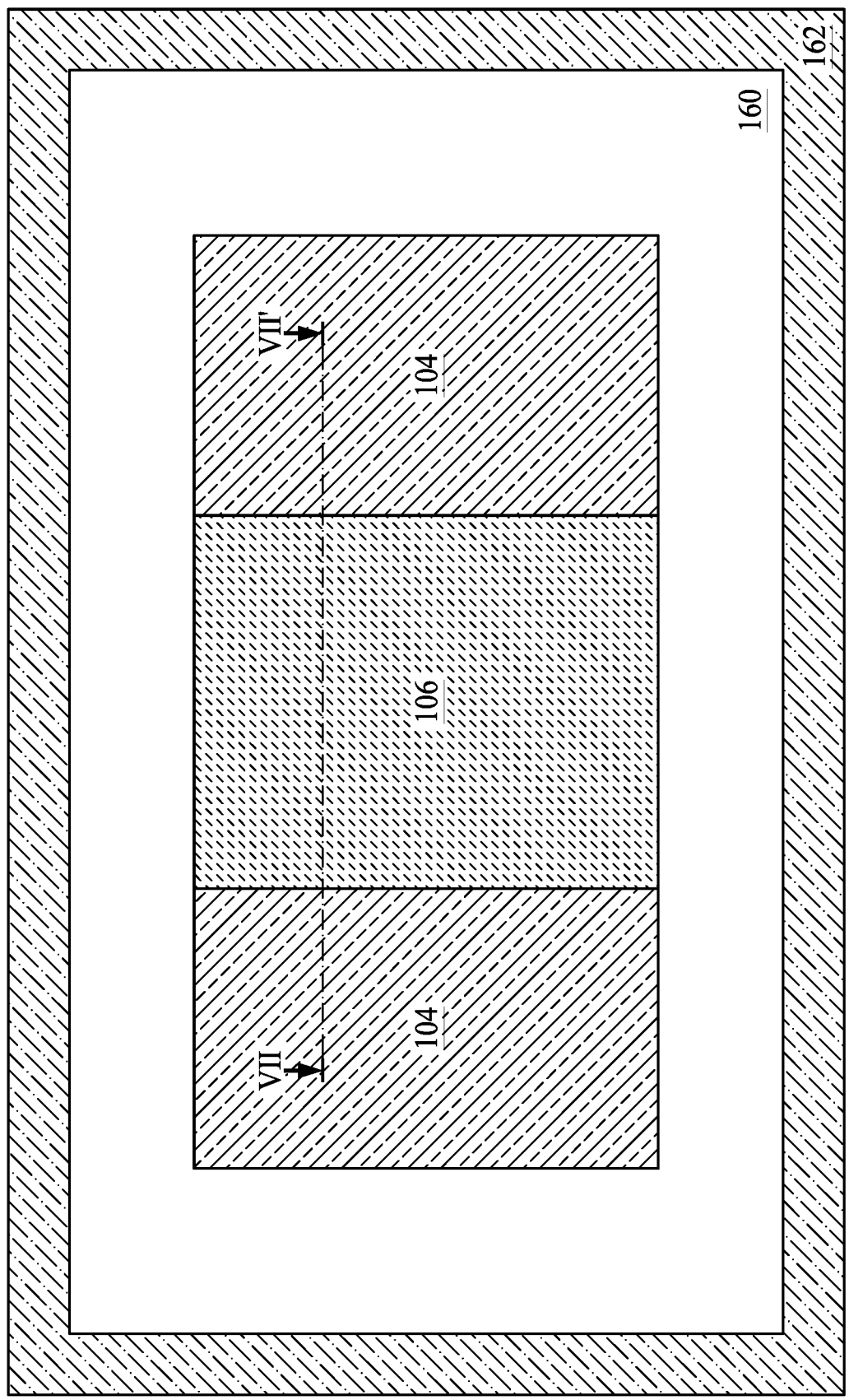
FIGS. 10A to 13B are schematic drawings illustrating the semiconductor structure at various fabrication stages according to aspects of the present disclosure in one or more embodiments.
Figure 10B:
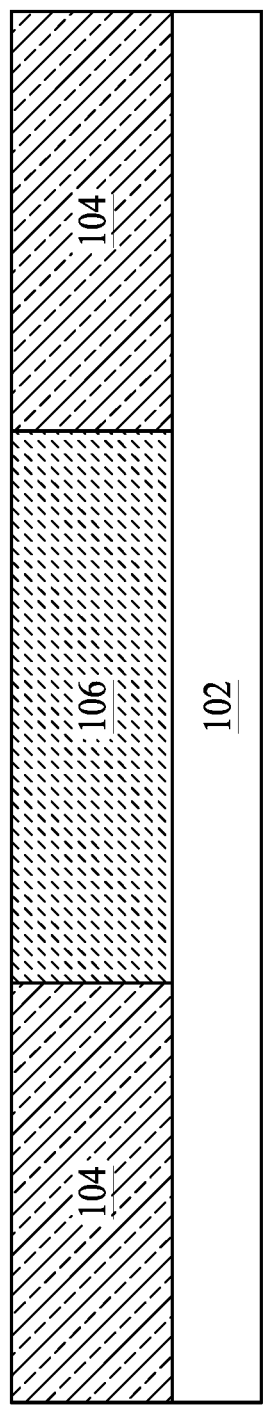

Referring to FIGS. 10A and 10B, wherein FIG. 10B is a cross-sectional view taken along line VII-VII of FIG. 10A, in operation 31, at least a well region 104 and a well region 106 are formed over a substrate 102. In some embodiments, the well region 104 include dopants of a first conductivity type, and the substrate 102 and the well region 106 include dopants of a second conductivity type. The first conductivity type and the second conductivity type are complementary to each other. For example, in some embodiments, the first conductivity type is an n type, and the second conductivity type is a p type. In some alternative embodiments, the first conductivity type is a p type, and the second conductivity type is an n type. As shown in FIG. 10A, sides of the well region 106 may be respectively in contact with the well regions 104. In some embodiments, bottoms of the well regions 104 and 106 may be in contact with the substrate 102. However, other well regions or buried well regions may be formed between the substrate 102 and the well regions 104 and 106, depending on different product designs.

In some embodiments, different ion implantations may be performed to form the well regions 104 and the well region 106. In some embodiments, the well regions 104 may be formed prior to the forming of the well region 106. In some alternative embodiments, the well regions 104 are formed after the forming of the well region 106, depending on process designs.

Additionally, an isolation structure 160 defining a location and a dimension of the HV device may be formed in the substrate 102 prior to the forming of the well regions 104 and 106. In some embodiments, a guard ring 162 may be formed surrounding the isolation structure 160. The guard ring 162 may be formed prior to the forming of the well regions 104 and 106, but the disclosure is not limited thereto.

Figure 11A:
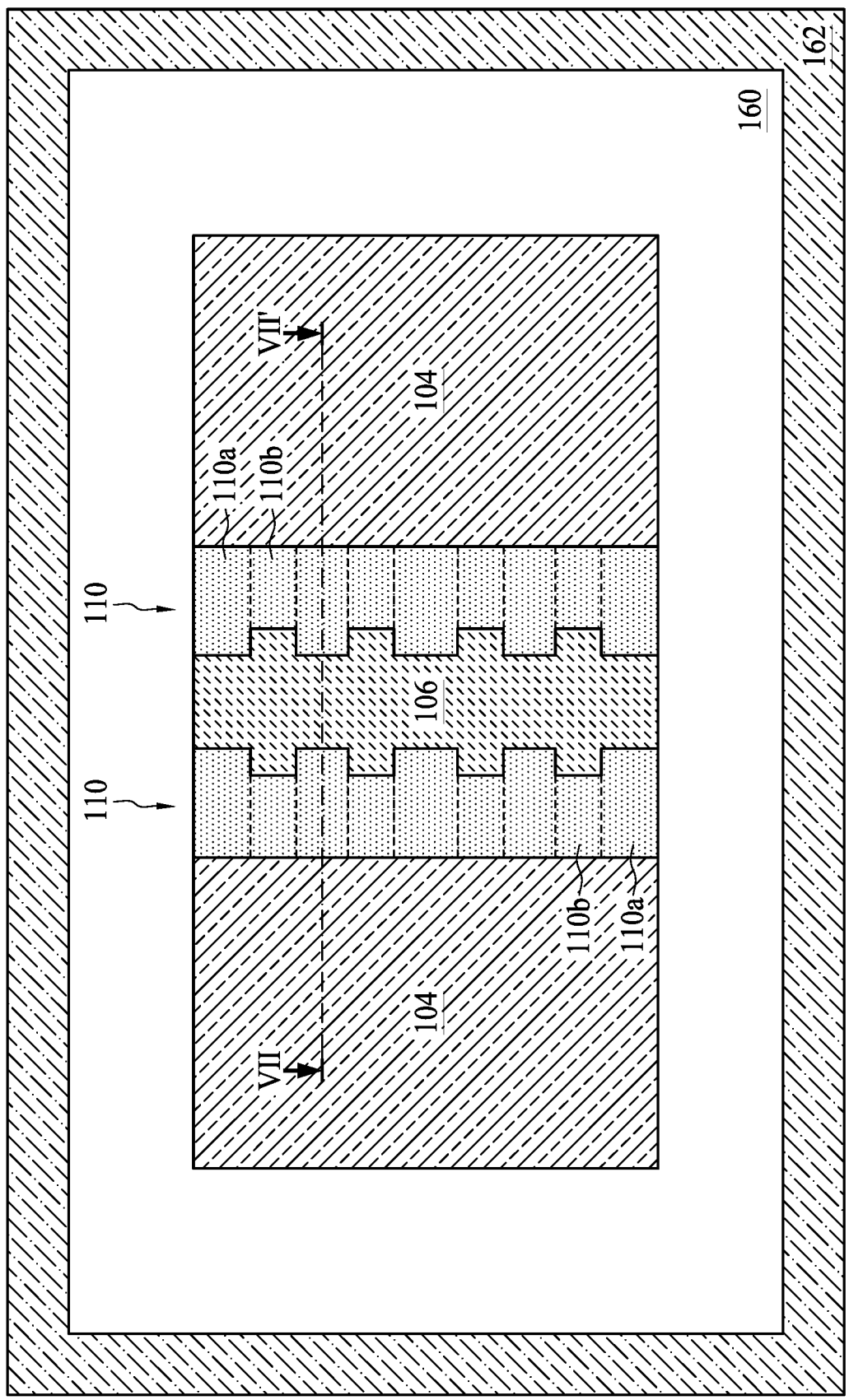
Figure 11B:
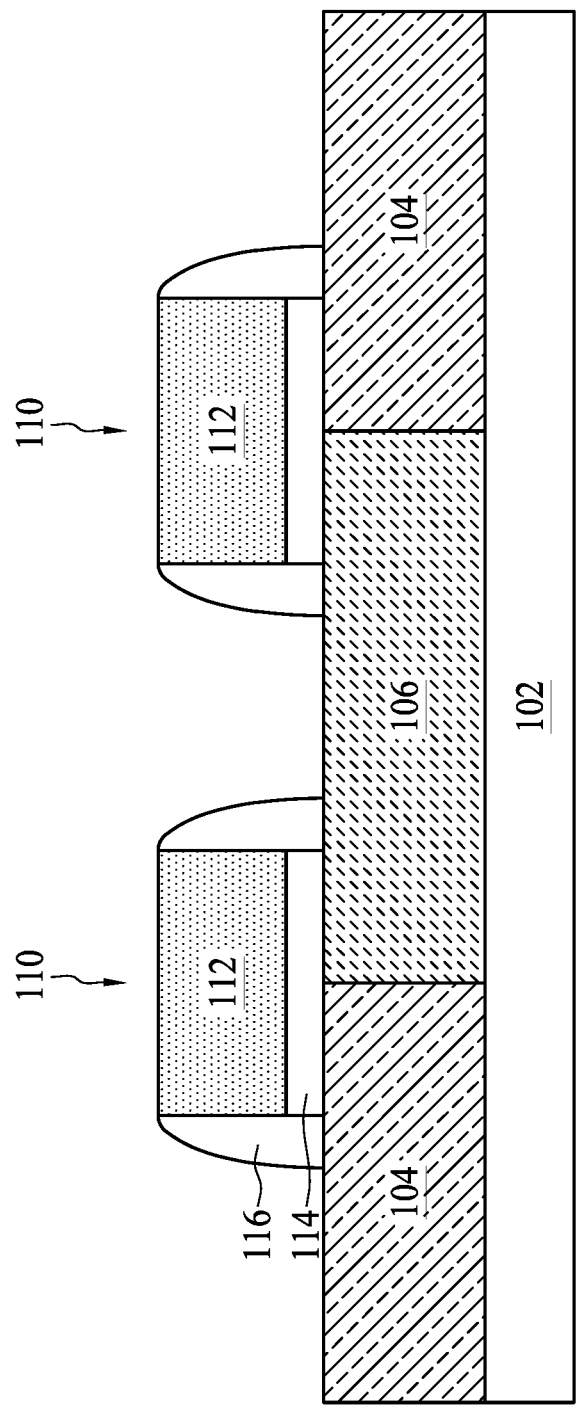

Referring to FIGS. 11A and 11B, in operation 32, a gate structure 110 is formed over the well region 104 and the well region 106. As mentioned above, the gate structure 110 covers a portion of the well region 104 and a portion of the well region 106. In some embodiments, a dielectric layer 114 and a conductive layer 112 are sequentially formed over the substrate 102. The dielectric layer 114 and the conductive layer 112 are then patterned to form the gate structure 110. It should be noted that the gate structure 110 is patterned to include a plurality of first portions 110a and a plurality of second portions 110b alternately arranged, as shown in FIG. 11A. Further, widths of the first portions 110a are greater than widths of the second portions 110b, as mentioned above. Thus, the gate structure 110 obtains a comb-like configuration, as shown in FIG. 11A The arrangement and widths of the first portions 110a and the second portions 110b are similar to those described above; therefore, such details are omitted for brevity.

In some embodiments, spacers 116 are formed over sidewalls of each gate structure 110. As mentioned above, the spacers 116 include multiple layers, but the disclosure is not limited thereto. In some embodiments, the spacers 116 are formed by deposition and etch-back operations.

Figure 12A:
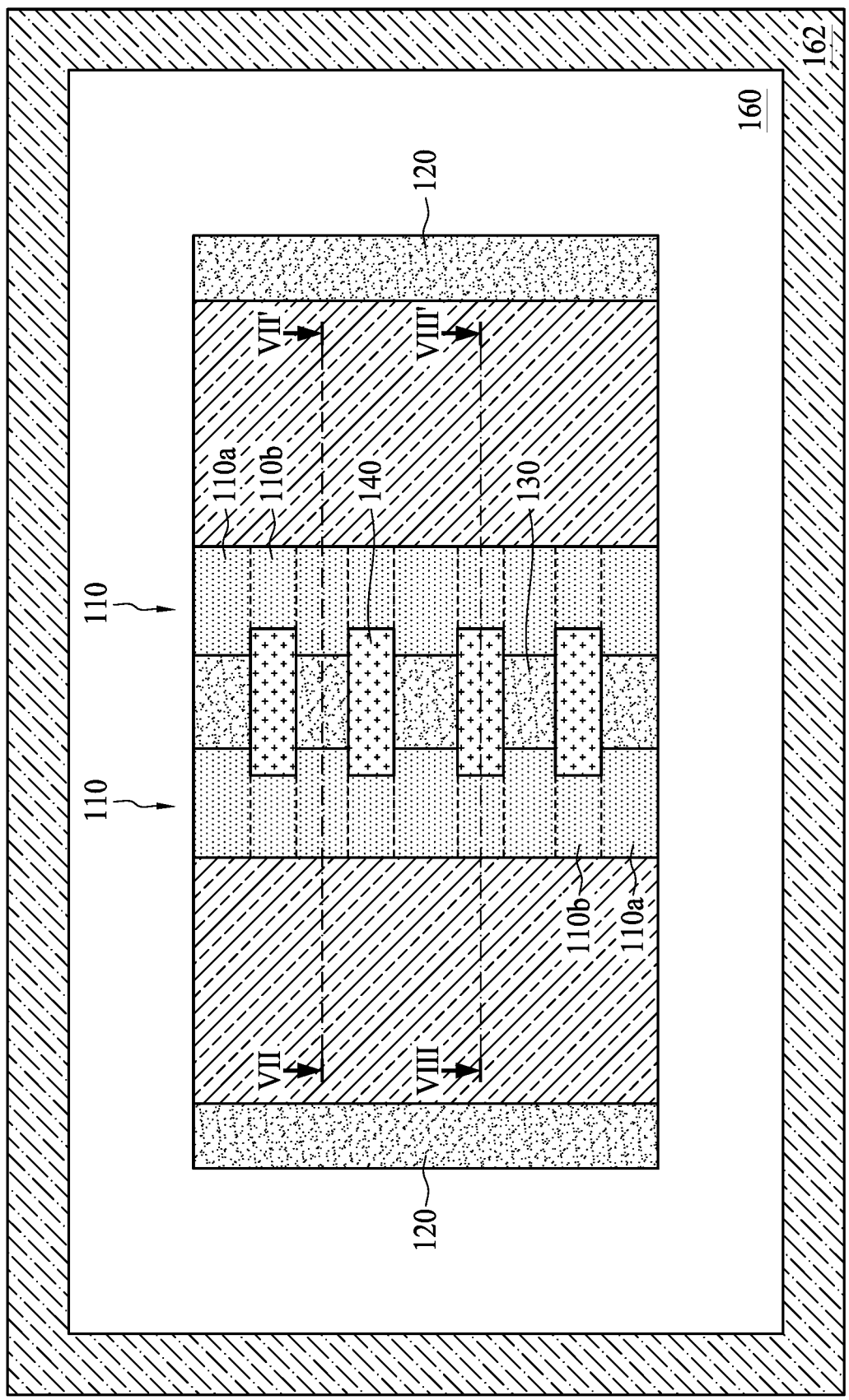
Figure 12B:
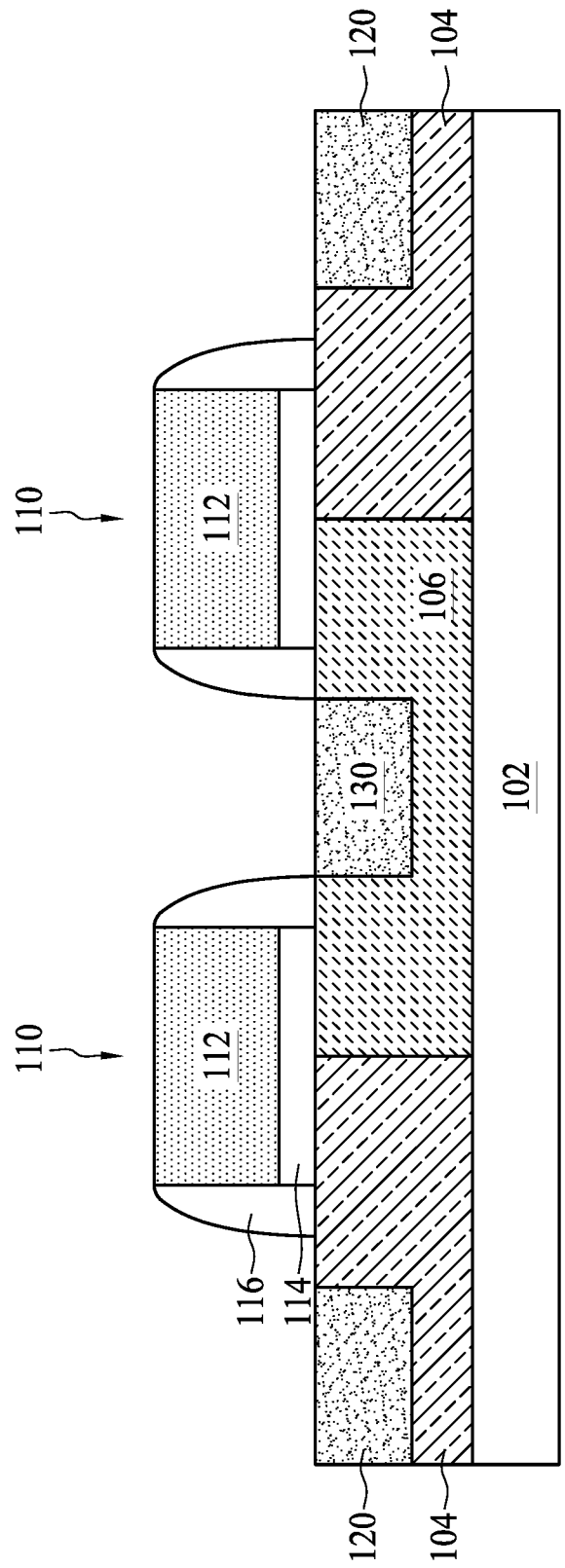
Figure 12C:
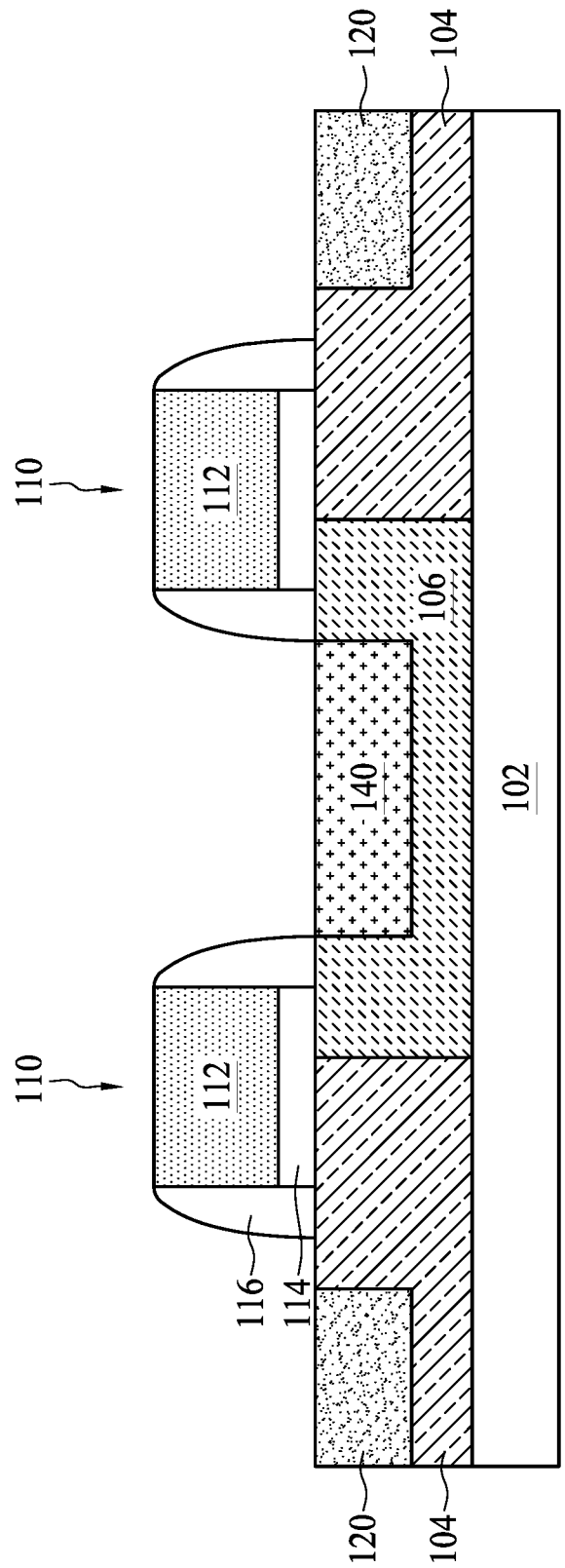

Referring to FIGS. 12A to 12C, in operation 33, a drain region 120 is formed in the well region 104, and a plurality of source regions 130 are formed in the well region 106. Further, each of the source regions 130 is adjacent to the first portion(s) 110a of the gate structure 110. Both the drain region 120 and the source regions 130 include dopants of the first conductivity type. Therefore, the drain region 120 and the source regions 130 are formed simultaneously. Doping concentrations of the drain region 120 and the source regions 130 are the same. Further, the doping concentrations of the drain region 120 and the source regions 130 are greater than a doping concentration of the well region 104.

Still referring to FIGS. 12A to 12C, in operation 34, a plurality of doped regions 140 are formed in the well region 106. In some embodiments, the doped regions 140 and the source regions 130 are alternately arranged in the well region 106. Further, the doped regions 140 are separated from edges of the HV device by the source regions 130. As mentioned above, a width of the doped region 140 is greater than a width of the source region 130. Further, each of the doped regions 140 is adjacent to the second portion(s) 110b of the gate structure 110.

It should be noted that in some embodiments, operation 33 is performed prior to operation 34. However, in some alternative embodiments, operation 34 is performed prior to operation 33, depending on the process design.

Accordingly, an HV device 100 is obtained.

Figure 13A:
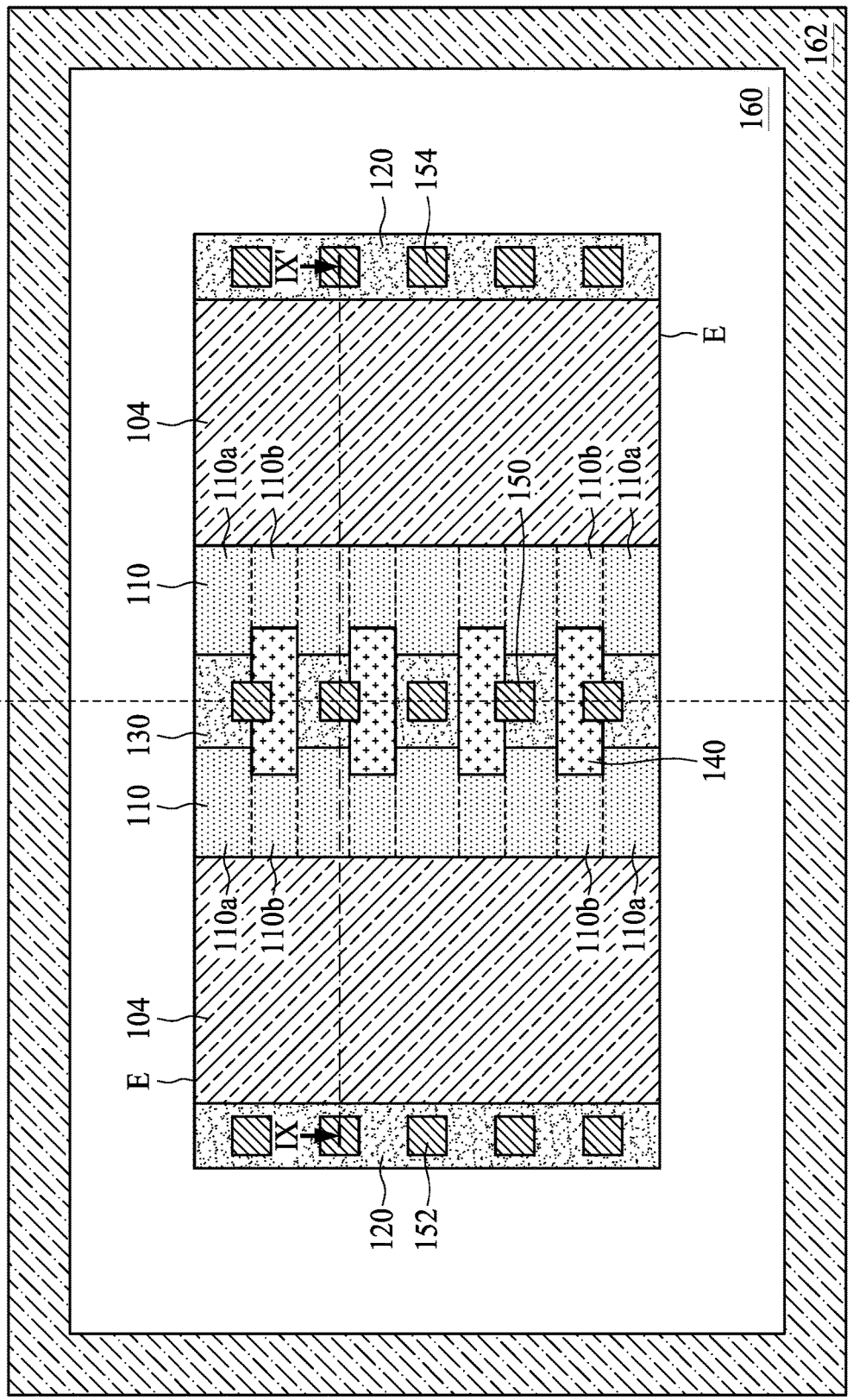
Figure 13B:
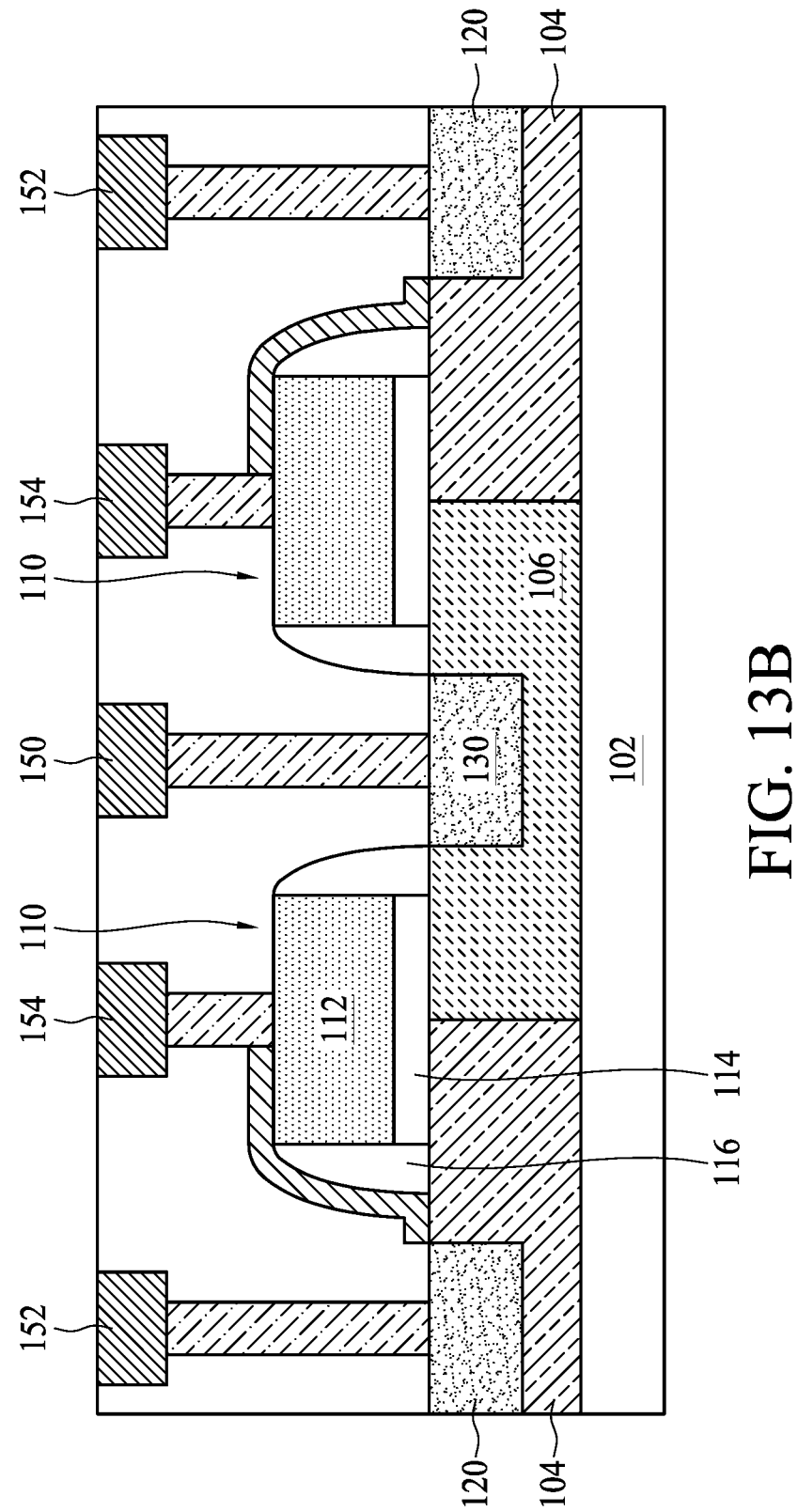

Referring to FIGS. 13A and 13B, in some embodiments, a plurality of conductive structures 150, 152 and 154 may be formed after the forming of the HV device 100. As shown in FIGS. 13A and 13B, the conductive structures 150 are formed over the well region 106, and the conductive structures 152 are formed over the well region 104. Further, the conductive structures 150 are in contact with the source regions 130 and/or the doped regions 140, while the conductive structures 152 are in contact with the drain regions 120.

Referring back to FIGS. 5 to 8, in some embodiments, the isolation structures 208 may be formed prior to or after the forming of the well regions 204 and 206, but the disclosure is not limited thereto. In such embodiments, the method 30 may be performed to form the HV device 200, and repeated descriptions of details are omitted for brevity.

The present disclosure therefore provides an HV device having a lower bulk resistance and thus an on-state breakdown voltage is increased. In some embodiments, the HV device includes a plurality of doped regions and a plurality of source regions alternately arranged. Further, widths of added doped regions are greater than widths of the source regions. Carrier collection is improved by the added doped regions. Accordingly, the bulk resistance is reduced and the on-state breakdown voltage is increased.

According to one embodiment of the present disclosure, an HV device is provided. The HV device includes a substrate, a gate structure over the substrate, a drain region disposed on a first side of the gate structure, a plurality of source regions disposed on a second side of the gate structure, and a plurality of doped regions disposed on the second side of the gate structure. The gate structure includes a plurality of first portions and a plurality of second portions alternately arranged. Widths of the first portions are greater than widths of the second portions. The source regions are adjacent to the first portions of the gate structures, and the doped regions are adjacent to the second portions of the gate structure. The drain region and the source regions include dopants of a first conductivity type, and the doped regions include dopants of a second conductivity type. The first conductivity type and the second conductivity type are complementary to each other.

According to one embodiment of the present disclosure, an HV device is provided. The HV device includes a first gate structure and a second gate structure, a plurality of source regions disposed between the first gate structure and the second gate structure, a plurality of doped regions disposed between the first gate structure and the second gate structure, and a first drain region and a second drain region. Each of the first gate structure and the second gate structure includes a plurality of first portions and a plurality of second portions alternately arranged. Widths of the first portions are greater than widths of the second portions. Each of the source regions is between the one of the first portions of the first gate structure and one of the first portions of the second gate structure. Each of the doped regions is between the one of the second portions of the first gate structure and one of the second portions of the second gate structure. The first and second gate structures, the source regions and the doped regions are disposed between the first drain region and the second drain region. The first and second drain regions and the source regions include dopants of a first conductivity type, and the doped regions include dopants of a second conductivity type. The first conductivity type and the second conductivity type are complementary to each other.

According to one embodiment of the present disclosure, a method for forming an HV device is provided. The method includes following operations. A first well region and a second well region are formed in a substrate. A gate structure is formed over the first well region and the second well region. The gate structure includes a plurality of first portions and a plurality of second portions. The first portions and the second portions are alternately arranged. Widths of the first portions are greater than widths of the second portions. A drain region is formed in the first well region, and a plurality of source regions are formed in the second well region. The source regions are adjacent to the first portions of the gate structure. A plurality of doped regions are formed in the second well region. The doped regions are adjacent to the second portions of the gate structure. The first well region, the drain region and the source regions include dopants of a first conductivity type. The second well region and the doped regions include dopants of a second conductivity type. The first conductivity type and the second conductivity type are complementary to each other.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A high-voltage device comprising:
   a substrate;
   a gate structure over the substrate, wherein the gate structure comprises a plurality of first portions and a plurality of second portions alternately arranged, and widths of the first portions are greater than widths of the second portions;
   a drain region disposed on a first side of the gate structure;
   a plurality of source regions disposed on a second side of the gate structure and adjacent to the first portions of the gate structure; and
   a plurality of doped regions disposed on the second side of the gate structure and adjacent to the second portions of the gate structure,
   wherein the source regions are arranged in a direction and line symmetrical with respective to a first central axis extending in the direction, the doped regions are arranged in the direction and line symmetrical with respective to a second central axis extending in the direction, and the first central axis overlaps the second central axis,
   wherein the drain region and the source regions comprise dopants of a first conductivity type, and the doped regions comprise dopants of a second conductivity type complementary to the first conductivity type.

2. The high-voltage device of claim 1, wherein widths of the source regions are less than widths of the doped regions.

3. The high-voltage device of claim 1, further comprising:
   a first well region in the substrate, wherein the first well region comprises dopants of the first conductivity type; and
   a second well region in the substrate, wherein the second well region comprises dopants of the second conductivity type.

4. The high-voltage device of claim 3, wherein the drain region is disposed in the first well region, and the source regions and the doped regions are disposed in the second well region.

5. The high-voltage device of claim 3, wherein a doping concentration of the drain region is greater than a doping concentration of the first well region.

6. The high-voltage device of claim 3, wherein a doping concentration of the doped regions is greater than a doping concentration of the second well region.

7. The high-voltage device of claim 3, wherein the gate structure covers a portion of the first well region and a portion of the second well region.

8. The high-voltage device of claim 1, wherein the second portions of the gate structure are separated from an edge of the high-voltage device by the first portions of the gate structure, and the doped regions are separated from the edge of the high-voltage device by the source regions.

9. A high-voltage device comprising:
   a first gate structure and a second gate structure, wherein each of the first gate structure and the second gate structure comprises a plurality of first portions and a plurality of second portions alternately arranged, and widths of the first portions are greater than widths of the second portions;
   a plurality of source regions disposed between the first gate structure and the second gate structure, wherein each of the source regions is between one of the first portions of the first gate structure and one of the first portions of the second gate structure;
   a plurality of doped regions disposed between the first gate structure and the second gate structure, wherein each of the doped regions is between one of the second portions of the first gate structure and one of the second portions of the second gate structure; and
   a first drain region and a second drain region, wherein the first gate structure, the second gate structure, the source regions and the doped regions are disposed between the first drain region and the second drain region,
   wherein the source regions are arranged in a direction and line symmetrical with respective to a first central axis extending in the direction, the doped regions are arranged in the direction and line symmetrical with respective to a second central axis extending in the direction, and the first central axis overlaps the second central axis,
   wherein the first drain region, the second drain region and the source regions comprise dopants of a first conductivity type, and the doped regions comprise dopants of a second conductivity type complementary to the first conductivity type.

10. The high-voltage device of claim 9, further comprising:
  a first well region and a second well region comprising dopants of the first conductivity type; and
  a third well region between the first well region and the second well region, and comprising dopants of the second conductivity type.

11. The high-voltage device of claim 10, wherein the first drain region is disposed in the first well region, the second drain region is disposed in the second well region, and the source regions and the doped regions are disposed in the third well region.

12. The high-voltage device of claim 10, wherein doping concentrations of the first drain region and the second drain region are greater than doping concentrations of the first well region and the second well region.

13. The high-voltage device of claim 10, wherein doping concentrations of the doped regions are greater than a doping concentration of the third well region.

14. The high-voltage device of claim 9, further comprising a plurality of conductive structures disposed between the first gate structure and the second gate structure.

15. A high-voltage device comprising:
  a first well region and a second well region;
  a gate structure over the first well region and the second well region, wherein the gate structure comprises a plurality of first portions and a plurality of second portions alternately arranged, and widths of the first portions are greater than widths of the second portions;
  a drain region disposed in the first well region;
  a plurality of source regions disposed in the second well region;
  a plurality of doped regions disposed in the second well region,
  wherein the source regions are arranged in a direction and line symmetrical with respective to a first central axis extending in the direction, the doped regions are arranged in the direction and line symmetrical with respective to a second central axis extending in the direction, and the first central axis overlaps the second central axis,
  wherein the first well region, the drain region and the source regions comprise dopants of a first conductivity type, and the second well region the doped regions comprise dopants of a second conductivity type complementary to the first conductivity type, and the source regions and the doped regions are alternately arranged.

16. The high-voltage device of claim 15, wherein widths of the source regions are less than widths of the doped regions.

17. The high-voltage device of claim 15, wherein a doping concentration of the drain region is greater than a doping concentration of the first well region.

18. The high-voltage device of claim 15, wherein a doping concentration of the doped regions is greater than a doping concentration of the second well region.

19. The high-voltage device of claim 15, further comprising a plurality of conductive structures disposed over the second well region.

20. The high-voltage device of claim 19, wherein each of the conductive structures is coupled to one of the source regions and one of the doped region adjacent to the one of the source regions.

* * * * *